US012666815B2

(12) United States Patent
He et al.

(10) Patent No.: US 12,666,815 B2
(45) Date of Patent: Jun. 23, 2026

(54) ARRAY SUBSTRATE, TESTING METHOD AND MANUFACTURING METHOD THEREOF, AND DISPLAYING DEVICE

(71) Applicants: Mianyang BOE Optoelectronics Technology Co., Ltd., Mianyang (CN); BOE TECHNOLOGY GROUP CO., LTD., Beijing (CN)

(72) Inventors: Liangliang He, Beijing (CN); Wenli Zhang, Beijing (CN)

(73) Assignees: Mianyang BOE Optoelectronics Technology Co., Ltd., Mianyang (CN); BOE TECHNOLOGY GROUP CO., LTD., Beijing (CN)

( * ) Notice: Subject to any disclaimer, the term of this patent is extended or adjusted under 35 U.S.C. 154(b) by 598 days.

(21) Appl. No.: 17/514,392

(22) Filed: Oct. 29, 2021

(65) Prior Publication Data

US 2022/0310758 A1 Sep. 29, 2022

(30) Foreign Application Priority Data

Mar. 24, 2021 (CN) .......................... 202110316081.6

(51) Int. Cl.
| | |
|---|---|
| *H10K 59/131* | (2023.01) |
| *G09G 3/00* | (2006.01) |
| *H10K 59/12* | (2023.01) |
| *H10K 59/122* | (2023.01) |
| *H10K 59/88* | (2023.01) |

(52) U.S. Cl.
CPC ........... *H10K 59/131* (2023.02); *G09G 3/006* (2013.01); *H10K 59/122* (2023.02); *H10K 59/88* (2023.02); *H10K 59/1201* (2023.02)

(58) Field of Classification Search
None
See application file for complete search history.

(56) References Cited

U.S. PATENT DOCUMENTS

| | | | | |
|---|---|---|---|---|
| 2001/0040565 A1* | 11/2001 | Koyama | ................ | H10K 71/70 |
| | | | | 345/204 |
| 2019/0207036 A1* | 7/2019 | Tian | ...................... | H10D 86/481 |
| 2020/0052057 A1* | 2/2020 | Kim | ...................... | H10K 59/131 |

\* cited by examiner

*Primary Examiner* — Jessica S Manno
*Assistant Examiner* — Christopher A. Schodde
(74) *Attorney, Agent, or Firm* — Intellectual Valley Law, P.C.

(57) ABSTRACT

An array substrate, a testing method and manufacturing method thereof, and a displaying device. According to the disclosure, a plurality of test capacitors connected in parallel, a first connecting wire, a second connecting wire, a first test terminal and a second test terminal are arranged in an array substrate located in a test area, each test capacitor comprises a first electrode, a first insulating layer and a second electrode which are stacked on a base, and each test capacitor has the same film structure as a storage capacitor arranged in an active area. By making the first electrode of each test capacitor in the test area connected to the first test terminal through the first connecting wire, and the second electrode of each test capacitor connected to the second test terminal through the second connecting wire, the plurality of test capacitors are connected in parallel.

11 Claims, 11 Drawing Sheets

34
41
27
22
25
43
42
10

34     33     101     102

10

D     D'

C
C'

31

32

20

50

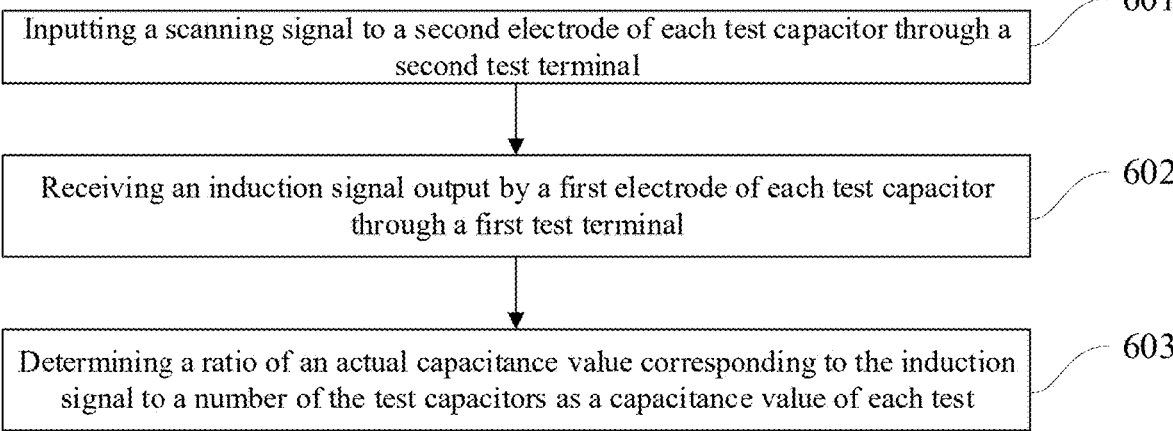

Fig. 5

| | |
|---|---|
| Inputting a scanning signal to a second electrode of each test capacitor through a second test terminal | 601 |
| Receiving an induction signal output by a first electrode of each test capacitor through a first test terminal | 602 |
| Determining a ratio of an actual capacitance value corresponding to the induction signal to a number of the test capacitors as a capacitance value of each test | 603 |

Fig. 6

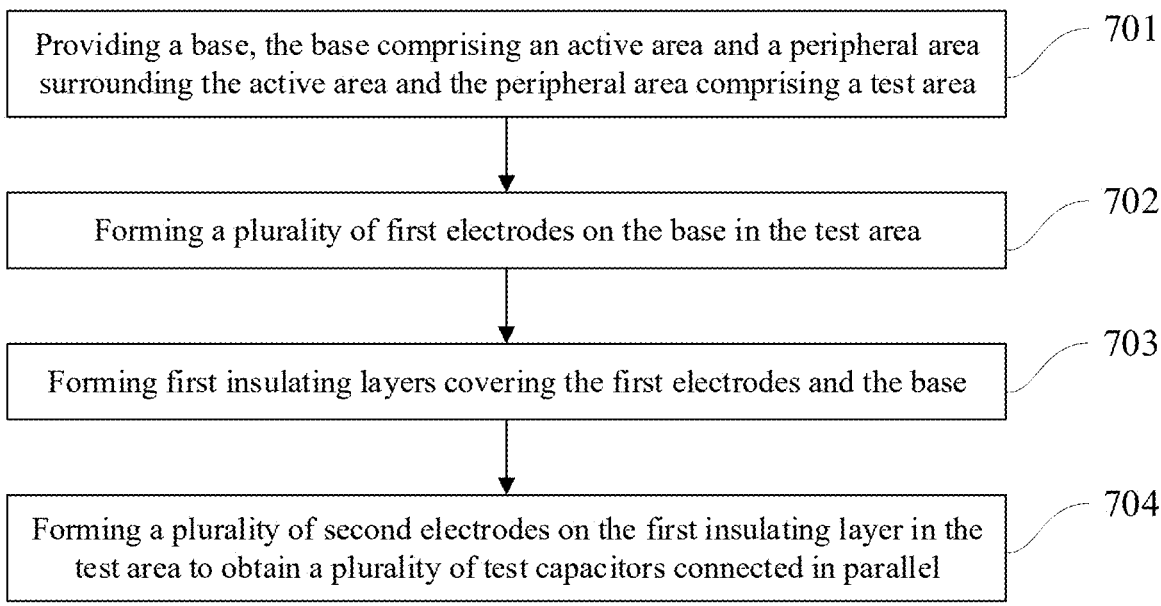

701 — Providing a base, the base comprising an active area and a peripheral area surrounding the active area and the peripheral area comprising a test area 702 — Forming a plurality of first electrodes on the base in the test area 703 — Forming first insulating layers covering the first electrodes and the base 704 — Forming a plurality of second electrodes on the first insulating layer in the test area to obtain a plurality of test capacitors connected in parallel

Fig. 7

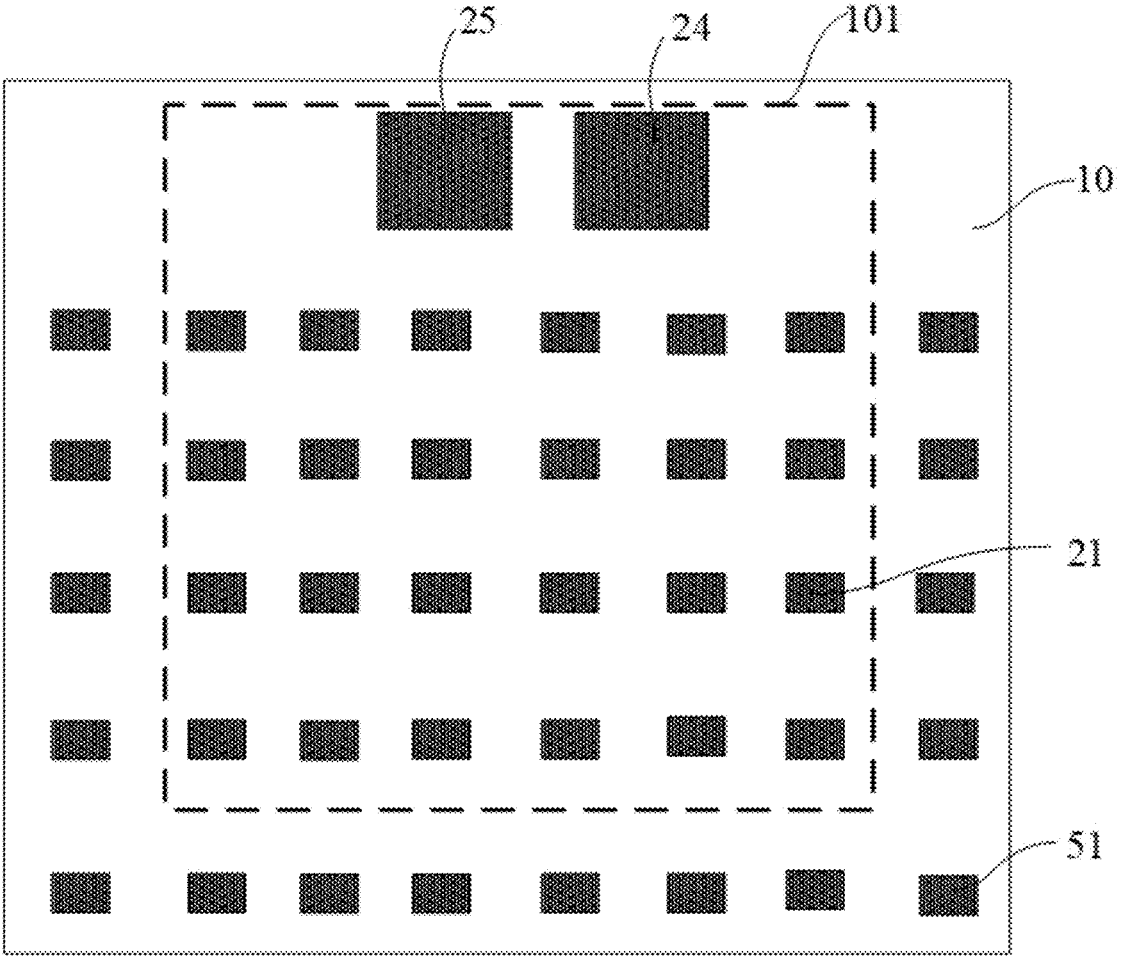

Fig. 8

ARRAY SUBSTRATE, TESTING METHOD AND MANUFACTURING METHOD THEREOF, AND DISPLAYING DEVICE

CROSS REFERENCE TO RELEVANT APPLICATIONS

The present application claims the priority of the Chinese patent application filed on Mar. 24, 2021 before the Chinese Patent Office with the application number of 202110316081.6 and the title of "ARRAY SUBSTRATE, TESTING METHOD AND MANUFACTURING METHOD THEREOF, AND DISPLAYING DEVICE", which is incorporated herein in its entirety by reference.

TECHNICAL FIELD

The disclosure relates to the technical field of display, in particular to an array substrate, a testing method and manufacturing method thereof, and a displaying device.

BACKGROUND

With the continuous development of display technologies, the requirements for the quality and yield of display products are getting higher and higher. The performance of a storage capacitor, an important part of display products arranged in an active area, directly determines the quality of display products. Effective monitoring of the change of the storage capacitor is important for evaluating the film forming quality of an insulating layer between two polar plates in the storage capacitor.

At present, the performance of the storage capacitor arranged in the active area is characterized mainly by testing a test capacitor arranged in a test area of an array substrate.

SUMMARY

Some embodiments of the disclosure provide the following technical solution:

in a first aspect, an array substrate is provided, comprising: an active area and a peripheral area surrounding the active area, wherein the peripheral area comprises a test area;

the array substrate located in the test area comprises a plurality of test capacitors connected in parallel, a first connecting wire, a second connecting wire, a first test terminal and a second test terminal;

each test capacitor comprises a first electrode, a first insulating layer and a second electrode which are disposed in layer configuration on a base, and an overlapping area exists between an orthographic projection of the first electrode on the base and an orthographic projection of the second electrode on the base;

a storage capacitor arranged in the active area comprises a third electrode, the first insulating layer and a fourth electrode which are disposed in layer configuration, the third electrode is arranged on the same layer as the first electrode, the fourth electrode is arranged on the same layer as the second electrode, and an overlapping area exists between an orthographic projection of the third electrode on the base and an orthographic projection of the fourth electrode on the base; and the first electrode of each test capacitor is connected to the first test terminal through the first connecting wire, and the second electrode of each test capacitor is connected to the second test terminal through the second connecting wire.

In a second aspect, a testing method of an array substrate is provided, being applied to the above array substrate, and comprising:

inputting a scanning signal to a second electrode of each test capacitor through a second test terminal;

receiving an induction signal output by a first electrode of each test capacitor through a first test terminal; and determining a ratio of an actual capacitance value corresponding to the induction signal to the number of the test capacitors as a capacitance value of each test capacitor.

In a third aspect, a manufacturing method of an array substrate is provided, comprising:

providing a base, the base comprising an active area and a peripheral area surrounding the active area and the peripheral area comprising a test area;

forming a plurality of first electrodes on the base in the test area;

forming first insulating layers covering the first electrodes and the base; and forming a plurality of second electrodes on the first insulating layers in the test area to obtain a plurality of test capacitors connected in parallel;

wherein an overlapping area exists between an orthographic projection of each first electrode on the base and an orthographic projection of the second electrode on the base; a storage capacitor arranged in the active area comprises a third electrode, the first insulating layer and a fourth electrode which are disposed in layer configuration, the third electrode is arranged on the same layer as the first electrode, the fourth electrode is arranged on the same layer as the second electrode, and an overlapping area exists between an orthographic projection of the third electrode on the base and an orthographic projection of the fourth electrode on the base; and the first electrode of each test capacitor is connected to a first test terminal through a first connecting wire, and the second electrode of each test capacitor is connected to a second test terminal through a second connecting wire.

In a fourth aspect, a displaying device is provided, comprising the above array substrate.

BRIEF DESCRIPTION OF THE DRAWINGS

In order to more clearly explain the embodiments of the disclosure or the technical solution in the prior art, the following will briefly introduce the drawings needed in the description of the embodiments or the prior art. Obviously, the drawings in the following description only illustrate some embodiments of the disclosure. For those of ordinary skill in the art, other drawings can be obtained according to the following ones without creative labor.

FIG. 5 shows a schematic diagram of yet another array substrate located in a test area according to an embodiment of the disclosure;

FIG. 6 shows a flowchart of a testing method of an array substrate in an embodiment of the disclosure;

FIG. 7 shows a flowchart of a manufacturing method of an array substrate in an embodiment of the disclosure;

FIG. 8 shows a schematic diagram after a first electrode layer is formed on a base;

DETAILED DESCRIPTION

In order to make the above objects, features and advantages of the disclosure better understood, the disclosure will be described in further detail below with reference to the accompanying drawings and detailed description.

Figure 1:
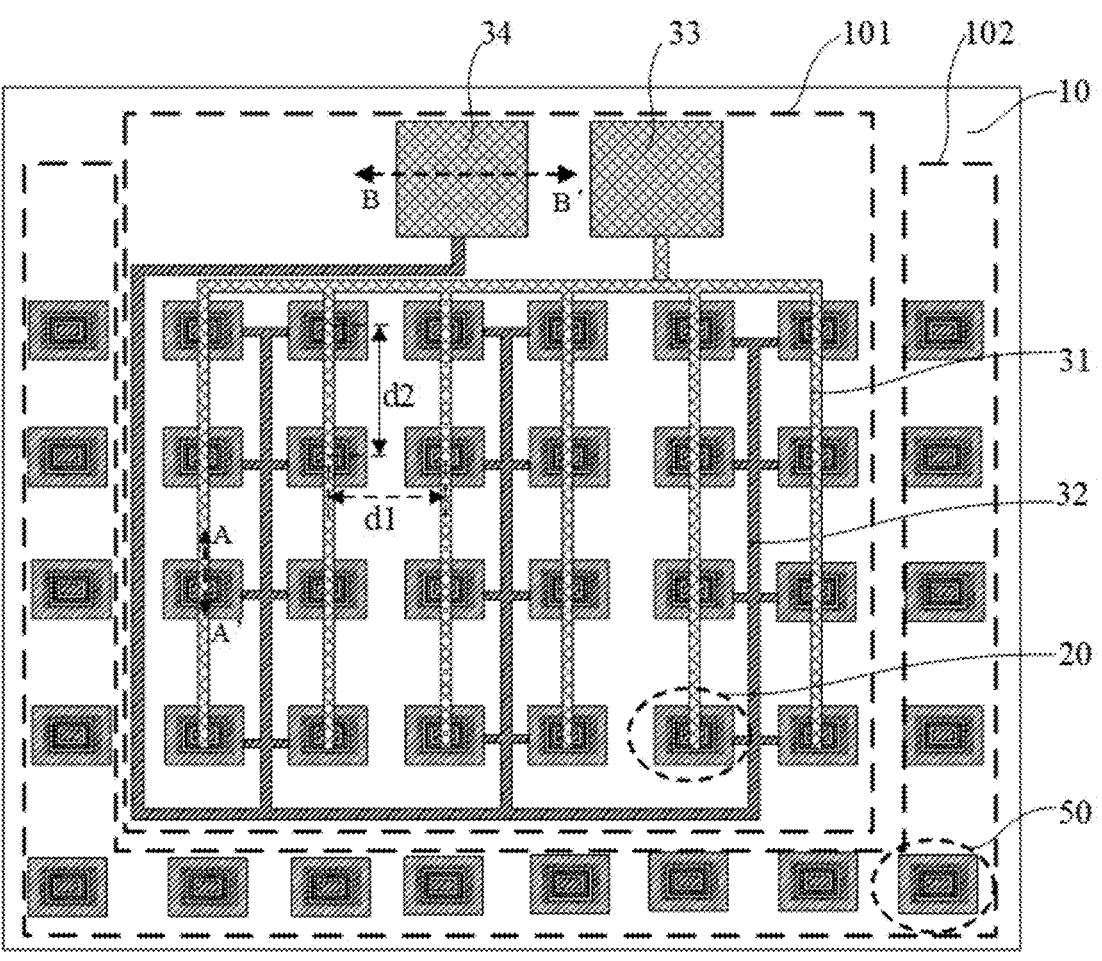
FIG. 1 shows a schematic diagram of an array substrate located in a test area according to an embodiment of the disclosure.
Figure 2:
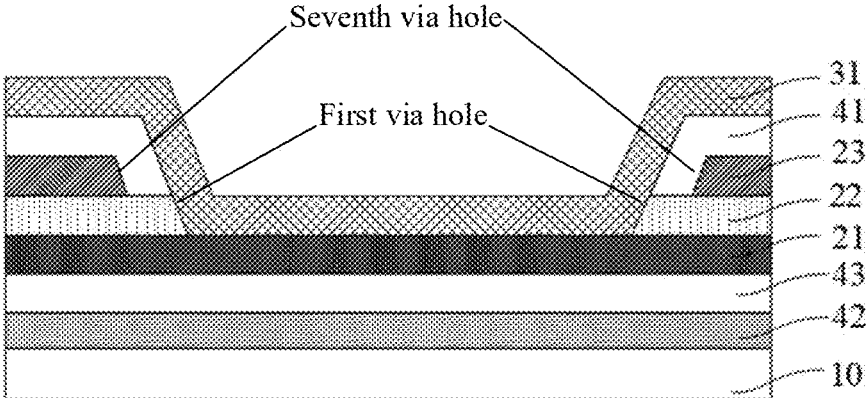
FIG. 2 shows a sectional view of the array substrate shown in FIG. 1 along the section A-A'.
Figures 3, 4:
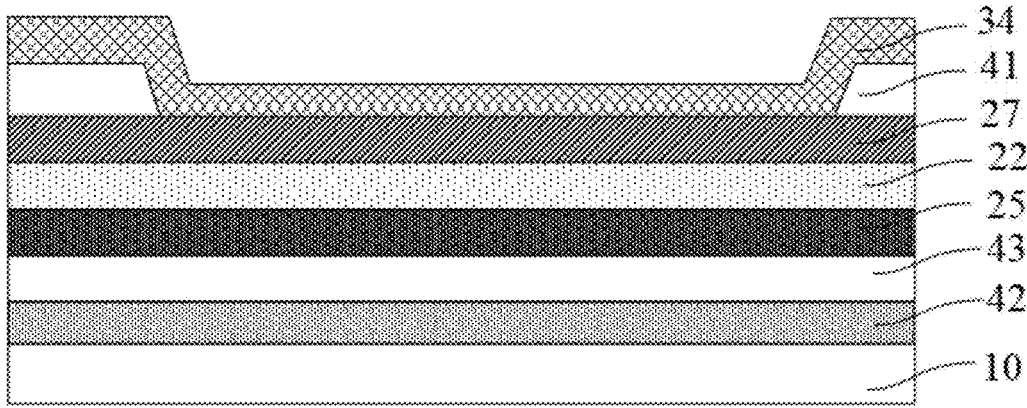
FIG. 3 shows a sectional view of the array substrate shown in FIG. 1 along the section B-B'.
FIG. 4 shows a schematic diagram of another array substrate located in a test area according to an embodiment of the disclosure.

FIG. 1 shows a schematic diagram of an array substrate located in a test area according to an embodiment of the disclosure; FIG. 2 shows a sectional view of the array substrate shown in FIG. 1 along the section A-A'; FIG. 3 shows a sectional view of the array substrate shown in FIG. 1 along the section B-B'; FIG. 4 shows another schematic diagram of array substrate located in a test area according to an embodiment of the disclosure; and FIG. 5 shows yet another schematic diagram of array substrate located in a test area according to an embodiment of the disclosure.

Referring to FIGS. 1 and 2, the embodiments of the disclosure provide an array substrate comprises: an active area and a peripheral area surrounding the active area, wherein the peripheral area comprises a test area 101; The array substrate located in the test area 101 comprises a plurality of test capacitors 20 connected in parallel, a first connecting wire 31, a second connecting wire 32, a first test terminal 33 and a second test terminal 34; each test capacitor 20 comprises a first electrode 21, a first insulating layer 22 and a second electrode 23 which are disposed in layer configuration on a base 10, and an overlapping area exists between an orthographic projection of the first electrode 21 on the base 10 and an orthographic projection of the second electrode 23 on the base 10; a storage capacitor disposed in the active area comprises a third electrode, the first insulating layer 22 and a fourth electrode which are disposed inn layer configuration, the third electrode is disposed on the same layer as the first electrode 21, the fourth electrode is disposed on the same layer as the second electrode 23, and an overlapping area exists between an orthographic projection of the third electrode on the base 10 and an orthographic projection of the fourth electrode on the base 10; and the first electrode 21 of each test capacitor 20 is connected to the first test terminal 33 through the first connecting wire 31, and the second electrode 23 of each test capacitor 20 is connected to the second test terminal 34 through the second connecting wire 32.

In a practical product, the array substrate comprises an active area and a peripheral area surrounding the active area, wherein a plurality of pixel units are disposed in the active area, each pixel unit comprises a plurality of sub-pixels, and the sub-pixel comprises an anode layer, an organic light-emitting layer and a cathode layer which are disposed in layer configuration; in addition, a pixel driving circuit connected to each sub-pixel is also disposed in the active area, and the pixel driving circuit is specifically connected to the anode layer of each sub-pixel for controlling the sub-pixel to emit light, wherein the pixel driving circuit comprises a switching transistor, a driving transistor and a storage capacitor, and the storage capacitor is connected to the driving transistor for storing a voltage input by a signal terminal and controlling the driving transistor to be turned on by the stored voltage, so that the driving transistor may input a driving signal to the anode layer of each sub-pixel to control the sub-pixel to emit light.

The peripheral area refers to a non-active area, and a test area 101 is disposed in the peripheral area, for example, the test area 101 refers to a Test Element Group (TEG) area. A plurality of test capacitors 20 are disposed in the test area 101. Each test capacitor 20 comprises a first electrode 21, a first insulating layer 22 and a second electrode 23 which are disposed in layer configuration, wherein the first electrode 21 is a lower polar plate of the test capacitor 20 and the second electrode 23 is an upper polar plate of the test capacitor 20.

The storage capacitor in the active area comprises a third electrode, the first insulating layer 22 and a fourth electrode. Because the performance of the storage capacitor in the active area needs to be detected by detecting a capacitance value of the test capacitor 20, the film structures of the test capacitor 20 and the storage capacitor in the active area need to be the same, that is, the third electrode and the first electrode 21 are disposed on the same layer, the fourth electrode and the second electrode 23 are disposed on the same layer, the first insulating layer 22 is disposed between the third electrode and the fourth electrode, and the first insulating layer 22 is also disposed between the first electrode 21 and the second electrode 23.

In addition, a first connecting wire 31, a second connecting wire 32, a first test terminal 33 and a second test terminal 34 are disposed in the test area 101. The first electrode 21 of each test capacitor 20 is connected to the first test terminal 33 through the first connecting wire 31, and the second electrode 23 of each test capacitor 20 is connected to the second test terminal 34 through the second connecting wire 32, so that the plurality of test capacitors 20 are connected in parallel through the first connecting wire 31 and the second connecting wire 32, that is, the first electrode 21 of each test capacitor 20 is connected to the first test terminal 33, and the second electrode 23 of each test capacitor 20 is connected to the second test terminal 34.

When the performance of the storage capacitor in the array substrate is tested subsequently, the plurality of test capacitors 20 connected in parallel and disposed in the test area 101 may be used for testing. Specifically, a scanning signal is input to the second test terminal 34, the scanning signal is input to the second electrode 23 of each test capacitor 20 through the second test terminal 34 and the second connecting wire 32, so that the first electrode 21 of each test capacitor 20 generates an induction signal, and the first electrode 21 of each test capacitor 20 outputs the induction signal to the first test terminal 33 through the first connecting wire 31.

Since the test capacitors 20 are connected in parallel, an actual value of capacitance corresponding to the induction signal output to the first test terminal 33 is the sum of the values of capacitance of the test capacitors 20, and a detected actual value of capacitance is much greater than that of a test capacitor disposed in the test area in the prior art. Therefore, when the film quality of the storage capacitor in the array substrate changes, the detected actual value of capacitance in the embodiment of the disclosure changes more significantly, and accordingly, it is easier to detect the performance of the storage capacitor, thus improving the detection efficiency and effectiveness. In addition, in the embodiment of the disclosure, the detection is performed by the plurality of test capacitors 20 connected in parallel, so that the detected actual value of capacitance is more accurate, i.e., the measurement accuracy is high, so that the storage capacitor disposed in the active area may be effectively monitored.

In the embodiment of the disclosure, the first electrode 21 of each test capacitor 20 is located on a first electrode layer, and the second electrode 23 of each test capacitor 20 is located on a second electrode layer. The array substrate located in the test area 101 also comprises a second insulating layer 41 disposed on a side, away from the first insulating layer 22, of the second electrode layer, and a third electrode layer disposed on a side, away from the second electrode layer, of the second insulating layer 41.

That is, the first electrodes 21 of all the test capacitors 20 are disposed on the same layer, and the second electrodes 23 of all the test capacitors 20 are also disposed on the same layer.

The purpose of disposing the third electrode layer on the side, away from the second electrode layer, of the second insulating layer 41 is to connect the first electrode 21 of each test capacitor 20 to the first test terminal 33 through the first connecting wire 31 and connect the second electrode 23 of each test capacitor 20 to the second test terminal 34 through the second connecting wire 32.

In an optional embodiment of the disclosure, as shown in FIG. 1, the first connecting wire 31, the first test terminal 33 and the second test terminal 24 are all located on the third electrode layer, and the second connecting wire 32 is located on the second electrode layer. The first connecting wire 31 is connected to the first electrode 21 of each test capacitor 20 through first via holes penetrating through the second insulating layer 41 and the first insulating layer 22, and the first connecting wire 31 and the first test terminal 33 are disposed on the same layer and connected to each other; and The second connecting wire 32 and the second electrode 23 of each test capacitor 20 are disposed on the same layer and connected to each other, and the second test terminal 34 is connected to the second connecting wire 32 through a second via hole penetrating through the second insulating layer 41.

In this case, the first electrode layer comprises the first electrode 21 of each test capacitor 20, the second electrode layer comprises the second electrode 23 of each test capacitor 20, and the second connecting wire 32 connected to each second electrode 23, and the third electrode layer comprises the first connecting wire 31, the first test terminal 33 and the second test terminal 34.

When detecting the value of capacitance of the test capacitor 20, the second test terminal 34 is used to receive the scanning signal input by test equipment to input the scanning signal to each second electrode 23 through the second connecting wire 32, and the first test terminal 33 is used to receive the induction signal output by each first electrode 21 through the first connecting wire 31 to output the induction signal to the test equipment.

In a practical product, as shown in FIG. 1, the first connecting wire 31 comprises a plurality of first sub-connecting wires distributed in the column direction and second sub-connecting wires connecting each first sub-connecting wire to the first test terminal 33, and each first sub-connecting wire is connected to each first electrode 21 in the same column through the first via holes penetrating through the second insulating layer 41 and the first insulating layer 22. In this case, the number of the first sub-connecting wires is the same as the number of columns of the first electrodes 21.

The second connecting wire 32 comprises a plurality of third sub-connecting wires distributed in the column direction and fourth sub-connecting wires connecting each third sub-connecting wire to the second test terminal 34, and each third sub-connecting wire is connected to each second electrode 23 in the $N^{th}$ column and each second electrode 23 in the $(N+1)^{th}$ column, where N is a positive odd number. If the number of columns of the second electrodes 23 is even, the number of columns of the second electrodes 23 is twice the number of the third sub-connecting wires. If the number of columns of the second electrodes 23 is odd, it is necessary to add another third sub-connecting wire to be connected to each second electrode 23 in the last column.

It should be noted that the distribution of the first connecting wire 31 and the second connecting wire 32 is not limited to the above manner. For example, the first sub-connecting wires included in the first connecting wire 31 may also be distributed in the row direction, and each first sub-connecting wire is connected to each first electrode 21 in the same row, the third sub-connecting wires included in the second connecting wire 32 are also distributed in the row direction, and each third sub-connecting wire is connected to each second electrode 23 in the same row or to each second electrode 23 in two adjacent rows.

In addition, in a practical product, the first electrode layer also comprises a first connection terminal and a second connection terminal, and the second electrode layer also comprises a third connection terminal and a fourth connection terminal. Overlapping areas exist between orthographic projections of the first connection terminal, the third connection terminal and the first test terminal 33 on the base 10, and overlapping areas exist between orthographic projections of the second connection terminal, the fourth connection terminal and the second test terminal 34 on the base 10. The fourth connection terminal is connected to the second connecting wire 32, as shown in FIG. 3, the second test terminal 34 is connected to the fourth connection terminal 27 through the second via hole penetrating through the second insulating layer 41, so that the second test terminal 34 is connected to the second connecting wire 32 through the fourth connection terminal 27. In FIG. 3, 25 refers to the second connection terminal in the first electrode layer.

It is noteworthy that the first connecting wire 31 is connected to the first electrode 21 of each test capacitor 20 through the first via holes penetrating through the second insulating layer 41 and the first insulating layer 22, the first connecting wire 31 is located on the third electrode layer, the first electrodes 21 are located on the first electrode layer, and the second electrodes 23 are also disposed between the third electrode layer and the first electrode layer; in order to avoid the contact between the second electrodes 23 and the first connecting wire 31, in a practical product, each second electrode 23 has a seventh via hole, the first via holes are located in an area enclosed by the seventh via holes, and the first via holes and the second electrodes 23 are separated by the second insulating layer 41.

That is to say, when the second electrodes 23 are formed, each second electrode 23 has a seventh via hole penetrating in a direction perpendicular to the base 10. Therefore, when the second insulating layer 41 is formed, the second insulating layer 41 may cover the seventh via holes. When the second insulating layer 41 and the first insulating layer 22 are patterned to form the first via holes subsequently, the first via holes need to be located in the area surrounded by the seventh via holes. That is, an orthographic projection of the first via hole on the base 10 is located within an orthographic projection of the seventh via hole on the base 10, so that the size of the first via hole is smaller than that of the seventh via hole, and then the first via holes and the second electrodes 23 are separated by the second insulating layer 41.

The orthographic projections of the first via holes and the seventh via holes on the base 10 are annular, such as a circular ring or a rectangular ring. That is, materials of the second electrode 23 are distributed on both inner and outer sides of the first via hole and the seventh via hole.

Certainly, the orthographic projections of the first via holes and the seventh via holes on the base 10 may also be a closed figure, such as a circle, a rectangle, etc. However, compared with the situation where the orthographic projections of the first via holes and the seventh via holes on the base 10 are a closed figure, by making the orthographic projections of the first via holes and the seventh via holes on the base 10 annular, the area of the second electrodes 23 may be further reduced, thus increasing the overlapping area between the first electrodes 21 and the second electrodes 23, and improving the test accuracy of the test capacitor 20.

In another optional embodiment of the disclosure, as shown in FIG. 4, the first connecting wire 31 is located on the first electrode layer, and the second connecting wire 32, the first test terminal 33 and the second test terminal 34 are all located on the third electrode layer. The first connecting wire 31 and the first electrode 21 of each test capacitor 20 are disposed on the same layer and connected to each other, and the first test terminal 33 is connected to the first connecting wire 31 through a third via hole penetrating through the second insulating layer 41 and the first insulating layer 22. The second connecting wire 32 is connected to the second electrode 23 of each test capacitor 20 through fourth via holes penetrating through the second insulating layer 41, and the second connecting wire 32 and the second test terminal 34 are disposed on the same layer and connected to each other.

In this case, the first electrode layer comprises the first electrode 21 of each test capacitor 20 and the first connecting wire 31 connected to each first electrode 21, the second electrode layer comprises the second electrode 23 of each test capacitor 20, and the third electrode layer comprises the second connecting wire 32, the first test terminal 33 and the second test terminal 34.

In a practical product, as shown in FIG. 4, the first connecting wire 31 comprises a plurality of first sub-connecting wires distributed in the column direction and second sub-connecting wires connecting each first sub-connecting wire to the first test terminal 33, and each first sub-connecting wire is connected to each first electrode 21 in the N$^{th}$ column and each first electrode 21 in the (N+1)$^{th}$ column, where N is a positive odd number. If the number of columns of the first electrodes 21 is even, the number of columns of the first electrodes 21 is twice the number of the first sub-connecting wires. If the number of columns of the first electrodes 21 is odd, it is necessary to add another first sub-connecting wire to be connected to each first electrode 21 in the last column.

The second connecting wire 32 comprises a plurality of third sub-connecting wires distributed in the column direction and fourth sub-connecting wires connecting each third sub-connecting wire to the second test terminal 34, and each third sub-connecting wire is connected to each second electrode 23 in the same column through the fourth via holes penetrating through the second insulating layer 41. In this case, the number of the third sub-connecting wires is the same as the number of columns of the second electrodes 23.

Since the second connecting wire 32 is connected to the second electrode 23 of each test capacitor 20 through the fourth via holes penetrating through the second insulating layer 41, the sectional view taken along the section C-C' shown in FIG. 4 is similar to that shown in FIG. 3, except that the second test terminal 34 in FIG. 3 is replaced with the second connecting wire 32, the fourth connection terminal 27 in the second electrode layer is replaced with the second electrode 23, and the second connection terminal 25 in the first electrode layer is replaced with the first electrode 21.

In a practical product, the first electrode layer also comprises a first connection terminal and a second connection terminal, and the second electrode layer also comprises a third connection terminal and a fourth connection terminal. The first connection terminal is connected to the first connecting wire 31, so the first test terminal 33 is connected to the first connection terminal through the third via hole penetrating through the second insulating layer 41 and the first insulating layer 22, thereby connecting the first test terminal 33 to the first connecting wire 31 through the first connection terminal.

It is noteworthy that the first test terminal 33 is connected to the first connection terminal through the third via hole penetrating through the second insulating layer 41 and the first insulating layer 22, the first test terminal 33 is located on the third electrode layer, the first connection terminal is located on the first electrode layer, and the third connection terminal is also disposed between the first test terminal 33 and the first connection terminal; in order to avoid the contact between the third connection terminal and the first test terminal 33, in a practical product, the third connection terminal has an eighth via hole, the third via hole is located in an area enclosed by the eighth via hole, and the third via hole and the third connection terminal are separated by the second insulating layer 41.

Therefore, the sectional view taken along the section D-D' shown in FIG. 4 is similar to that shown in FIG. 2, except that the first connecting wire 31 in FIG. 2 is replaced with the first test terminal 33, the second electrode 23 is replaced with the third connection terminal, and the first electrode 21 is replaced with the first connection terminal. Orthographic projections of the third via hole and the eighth via hole on the base 10 may be annular or closed.

In another optional embodiment of the disclosure, as shown in FIG. 5, the first connecting wire 31 is located on the first electrode layer, the second connecting wire 32 is located on the second electrode layer, and the first test terminal 33 and the second test terminal 34 are located on the third electrode layer. The first connecting wire 31 and the first electrode 21 of each test capacitor 20 are disposed on the same layer and connected to each other, and the first test terminal 33 is connected to the first connecting wire 31 through a fifth via hole penetrating through the second insulating layer 41 and the first insulating layer 22. The second connecting wire 32 and the second electrode 23 of each test capacitor 20 are disposed on the same layer and connected to each other, and the second test terminal 34 is connected to the second connecting wire 32 through a sixth via hole penetrating through the second insulating layer 41.

In this case, the first electrode layer comprises the first electrode 21 of each test capacitor 20 and the first connecting wire 31 connected to each first electrode 21, the second electrode layer comprises the second electrode 23 of each test capacitor 20 and the second connecting wire 32 connected to each second electrode 23, and the third electrode layer comprises the first test terminal 33 and the second test terminal 34.

In a practical product, as shown in FIG. 5, the first connecting wire 31 comprises a plurality of first sub-connecting wires distributed in the column direction and second sub-connecting wires connecting each first sub-connecting wire to the first test terminal 33, and each first sub-connecting wire is connected to each first electrode 21 in the $N^{th}$ column and each first electrode 21 in the $(N+1)^{th}$ column, where N is a positive odd number.

The second connecting wire 32 comprises a plurality of third sub-connecting wires distributed in the column direction and fourth sub-connecting wires connecting each third sub-connecting wire to the second test terminal 34, and each third sub-connecting wire is connected to each second electrode 23 in the $(N+1)^{th}$ column and each second electrode 23 in the $(N+2)^{th}$ column, where N is a positive odd number. If the number of columns of the second electrodes 23 is even, it is necessary to add two more third sub-connecting wires, which are respectively connected to each second electrode 23 in the first column and each second electrode 23 in the last column. If the number of columns of the second electrodes 23 is odd, it is necessary to add another third sub-connecting wire to be connected to each second electrode 23 in the first column.

In a practical product, the first electrode layer also comprises a first connection terminal and a second connection terminal, and the second electrode layer also comprises a third connection terminal and a fourth connection terminal. The first connection terminal is connected to the first connecting wire 31, so the first test terminal 33 is connected to the first connection terminal through the fifth via hole penetrating through the second insulating layer 41 and the first insulating layer 22, thereby connecting the first test terminal 33 to the first connecting wire 31 through the first connection terminal. The fourth connection terminal 27 is connected to the second connecting wire 32, so the second test terminal 34 is connected to the fourth connection terminal 27 through the sixth via hole penetrating through the second insulating layer 41, thereby connecting the second test terminal 34 to the second connecting wire 32 through the fourth connection terminal 27.

It is noteworthy that, in order to avoid the contact between the third connection terminal and the first test terminal 33, in a practical product, the third connection terminal has an eighth via hole, the fifth through hole is located in an area surrounded by the eighth via hole, and the fifth via hole and the third connection terminal are separated by the second insulating layer 41.

Therefore, the sectional view taken along the section F-F' shown in FIG. 5 is similar to that shown in FIG. 2, except that the first connecting wire 31 in FIG. 2 is replaced with the first test terminal 33, the second electrode 23 is replaced with the third connection terminal, and the first electrode 21 is replaced with the first connection terminal. A sectional view taken along the section E-E' shown in FIG. 5 is the same as the sectional view shown in FIG. 3.

In the embodiments of the disclosure, as shown in FIGS. 1, 4 and 5, in the test area 101, no overlapping area exists between an orthographic projection of the first connecting wire 31 on the base 10 and an orthographic projection of the second connecting wire 32 on the base 10.

If the orthographic projection of the first connecting wire 31 on the base 10 and the orthographic projection of the second connecting wire 32 on the base 10 overlap, parasitic capacitance may be generated between the first connecting wire 31 and the second connecting wire 32, which may affect the test accuracy of the test capacitor 20. Therefore, by reasonably designing the distribution of the first connecting wire 31 and the second connecting wire 32, no overlapping area may exist between the orthographic projection of the first connecting wire 31 on the base 10 and the orthographic projection of the second connecting wire 32 on the base 10, parasitic capacitance between the first connecting wire 31 and the second connecting wire 32 may be prevented, thereby improving the test accuracy of the test capacitor 20.

In an practical product, the number of the first electrodes 21 and the number of the second electrodes 23 are the same, and the materials of the first electrodes 21, the second electrodes 23, the first connecting wire 31, the second connecting wire 32, the first test terminal 33 and the second test terminal 33 are all conductive materials, such as metal materials.

In the embodiments of the disclosure, as shown in FIGS. 1, 4 and 5, the peripheral area further comprises a dummy area 102 surrounding the test area 101. The array substrate located in the dummy area 102 comprises a plurality of dummy capacitors 50, and the plurality of dummy capacitors 50 surround the test capacitors 20 disposed in the test area 101. Each dummy capacitor 50 comprises a fifth electrode, the first insulating layer 22, and a sixth electrode which are disposed in layer configuration, wherein the fifth electrode is disposed on the same layer as the first electrode 21, the sixth electrode is disposed on the same layer as the second electrode 23, and an overlapping area exists between an orthographic projection of the fifth electrode on the base 10 and an orthographic projection of the sixth electrode on the base 10.

That is to say, the dummy capacitor 50 has the same film structure as the test capacitor 20, that is, the fifth electrode is disposed on the same layer as the first electrode 21, the sixth electrode is disposed on the same layer as the second electrode 23, the first insulating layer 22 is disposed between the fifth electrode and the sixth electrode, and the first insulating layer 22 is also disposed between the first electrode 21 and the second electrode 23.

When the first electrode 21 and the second electrode 23 in the test capacitor 20 are formed by a patterning process, and the first via holes penetrating through the second insulating layer 41 and the first insulating layer 22 in FIG. 1 or the fourth via hole penetrating through the second insulating layer 41 in FIG. 2 is formed by etching, the over-etching problem easily occurs in an edge area of the test area 101, resulting in deviation of the test capacitors 20 in the edge area within the test area 101; as a result, the performance of the test capacitors 20 in the edge area and an inner area of the test area 101 may be inconsistent, which leads to inaccurate test results of the test capacitors 20. Therefore, in this embodiment of the disclosure, the plurality of dummy capacitors 50 are disposed in the dummy area 102 surrounding the test area 101, and when the test capacitors 20 are etched later, over-etched positions will be transferred to the dummy area 102, thus ensuring the consistency of the performance of the test capacitors 20 in the test area 101 and further improving the accuracy of the test results of the test capacitors 20.

It should be noted that when via holes are formed in the corresponding positions of the test capacitors 20 in the test area 101, via holes are also formed in corresponding film layers of the dummy capacitors 50. For example, the first via holes penetrating through the second insulating layer 41 and the first insulating layer 22 are provided in the test capacitor 20, which are used to connect the first connecting wire 31 to the first electrode 21 of each test capacitor 20, then via holes penetrating through the second insulating layer 41 and the first insulating layer 22 are also provided in the dummy capacitors 50 at corresponding positions, and the fifth electrode of the dummy capacitor 50 is exposed through the via hole.

In the embodiment of the disclosure, the plurality of test capacitors 20 located in the test area 101 are distributed in an array, and each test capacitor 20 has the same shape and size as the storage capacitor.

Since the storage capacitors in the active area are usually distributed in an array, the plurality of test capacitors 20 located in the test area 101 are also distributed in an array. By making the test capacitors 20 simulate the disposing of the storage capacitors in the active area, the test capacitors 20 may truly and effectively reflect the changes of the storage capacitors. The number of the test capacitors 20 in the test area 101 is set according to the practical product, which is not limited by the embodiment of the disclosure.

Further, each test capacitor 20 has the same shape and size as the storage capacitor. By making the test capacitors 20 simulate the shape and size of the storage capacitors in the active area, the test capacitors 20 may further truly and effectively reflect the changes of the storage capacitors.

For example, the orthographic projections of the first electrode 21 and the second electrode 23 in the test capacitor 20 on the base 10 are both rectangular, and the orthographic projections of the third electrode and the fourth electrode in the storage capacitor on the base 10 are also rectangular. In addition, in the row direction and the column direction, the size of the first electrode 21 is equal to that of the third electrode, and the size of the second electrode 23 is equal to that of the fourth electrode.

In the embodiment of the disclosure, a first size d1 of two adjacent test capacitors 20 is 30-40 μm in the row direction of the array substrate, and a second size d2 of two adjacent test capacitors 20 is 60-70 μm in the column direction of the array substrate.

The first size d1 of two adjacent test capacitors 20 in the row direction refers to a linear distance between the center points of the two test capacitors 20 in the row direction, and the first size d1 may be 31.9 μm, 35 μm, etc. The second size d2 of two adjacent test capacitors 20 in the column direction refers to a linear distance between the center points of the two test capacitors 20 in the column direction, and the second size d2 may be 63.8 μm, 65 μm, etc.

In a practical product, referring to FIGS. 1 and 2, the first electrode layer is a first grid layer, the second electrode layer is a second grid layer, the first insulating layer is a first grid insulating layer, the second insulating layer is an interlayer dielectric layer, and the third electrode layer is a source-drain electrode layer. As shown in FIGS. 2 and 3, an active layer 42 and a second grid insulating layer 43 are further disposed between the base 10 and the first grid layer, and the second grid insulating layer 43 is located on a side, away from the base 10, of the active layer 42. The array substrate located in the test area 101 also comprises a flat layer covering the source-drain electrode layer and the interlayer dielectric layer, an anode layer and a pixel defining layer disposed on the flat layer, and a support layer disposed on the pixel defining layer.

Since the third electrode of the storage capacitor in the active area is usually located on the first grid layer and the fourth electrode of the storage capacitor is located on the second grid layer, the first electrode layer is the first grid layer and the second electrode layer is the second grid layer, that is, the first electrode 21 of the test capacitor 20 is located on the first grid layer and the second electrode 23 of the test capacitor 20 is located on the second grid layer.

Certainly, it may be understood that the first electrode layer, the second electrode layer and the first insulating layer may also be other film layers in the array substrate, and are not limited to the above-mentioned first grid layer, second grid layer and first grid insulating layer.

The base 10 comprises an underlayer, a flexible layer disposed on the underlayer, and a buffer layer disposed on a side, away from the underlayer, of the flexible layer. An active layer 42 is disposed on a side, away from the flexible layer, of the buffer layer, and a second grid insulating layer 43 is disposed on a side, away from the buffer layer, of the active layer 42, so that the first electrode 21 of the subsequently formed test capacitor 20 is located on a side, away from the active layer 42, of the second grid insulating layer 43.

In addition, the array substrate located in the test area 101 also comprises a flat layer covering the source-drain electrode layer and the interlayer dielectric layer, and an anode layer and a pixel defining layer disposed on a side, away from the test capacitor 20, of the flat layer, wherein the pixel defining layer partially covers the anode layer and has a pixel opening exposing the anode layer, and a support layer is disposed on a side, away from the flat layer, of the pixel defining layer.

In the embodiment of the disclosure, the plurality of test capacitors are disposed in the test area of the array substrate, each test capacitor has the same film structure as the storage capacitor disposed in the active area, the first electrode of each test capacitor is connected to the first test terminal through the first connecting wire, and the second electrode of each test capacitor is connected to the second test terminal through the second connecting wire, so that the plurality of test capacitors are connected in parallel. The plurality of test capacitors connected in parallel and disposed in the test area can be used subsequently for testing, the detected value of capacitance changes more significantly and the detection result is more accurate, and accordingly, the performance of the storage capacitor may be detected more easily and accurately, so that the storage capacitor disposed in the active area may be effectively monitored.

Referring to FIG. 6 which shows a flowchart of a testing method of an array substrate in an embodiment of the disclosure, the test method is applied to the above array substrate and specifically comprises the following steps:

Step 601, inputting a scanning signal to a second electrode of each test capacitor through a second test terminal.

In the embodiment of the disclosure, when the performance of the storage capacitor disposed in the active area needs to be detected, the test equipment may input a scanning signal to the second test terminal 34, which is a voltage scanning signal, and then the scanning signal is input to the second electrode 23 of each test capacitor 20 through the second test terminal 34 and the second connecting wire 32.

Step 602, receiving an induction signal output by a first electrode of each test capacitor through a first test terminal.

In the embodiment of the disclosure, after the second electrode 23 of each test capacitor 20 receives the scanning signal, the first electrode 21 of each test capacitor 20 generates an induction signal, which is a current induction signal, the first electrode 21 of each test capacitor 20 outputs the induction signal to the first test terminal 33 through the first connecting wire 31, the first test terminal 33 outputs the induction signal to the test equipment, and the test equipment receives the induction signal output by the first electrode 21 of each test capacitor 20 through the first test terminal 33.

Step 603, determining a ratio of an actual value of capacitance corresponding to the induction signal to the number of the test capacitors as a value of capacitance of each test capacitor.

In the embodiment of the disclosure, after the test equipment receives the induction signal output by the first test terminal 33, the induction signal is a C-V curve, the abscissa represents a voltage value of the scanning signal, and the ordinate represents a value of capacitance of the test capacitor 20. By averaging the ordinate, an actual value of capacitance corresponding to the induction signal can be obtained.

Then, the number of the test capacitors 20 disposed in the test area 101 is determined, the actual value of capacitance corresponding to the induction signal is divided by the number of the test capacitors to obtain the value of capacitance of each test capacitor, and the performance of the storage capacitor disposed in the active area is evaluated based on the value of capacitance of each test capacitor.

In the embodiment of the disclosure, the plurality of test capacitors are disposed in the test area of the array substrate, each test capacitor has the same film structure as the storage capacitor disposed in the active area, the first electrode of each test capacitor is connected to the first test terminal through the first connecting wire, and the second electrode of each test capacitor is connected to the second test terminal through the second connecting wire, so that the plurality of test capacitors are connected in parallel. The plurality of test capacitors connected in parallel and disposed in the test area may be used subsequently for testing, the detected value of capacitance changes more significantly and the detection result is more accurate, and accordingly, the performance of the storage capacitor may be detected more easily and accurately, so that the storage capacitor disposed in the active area may be effectively monitored.

FIG. 7 is a flowchart of a manufacturing method of an array substrate in an embodiment of the disclosure, which may specifically comprise the following steps:

Step 701, providing a base, the base comprising an active area and a peripheral area surrounding the active area and the peripheral area comprising a test area.

In the embodiment of the disclosure, first, the base 10 is fabricated. Specifically, a flexible layer is formed on the underlayer, then a buffer layer is formed on the flexible layer, and the underlayer may be a glass underlayer. The base 10 comprises an active area and a peripheral area surrounding the active area, and the peripheral area comprises a test area 101.

Step 702, forming a plurality of first electrodes on the base in the test area.

In the embodiment of the disclosure, after the base 10 is formed, a plurality of first electrodes 21 are formed on the base 10 located in the test area 101 by a primary patterning process, each first electrode 21 is a lower polar plate of a test capacitor 20, and the first electrodes 21 of all the test capacitors 20 are located on a first electrode layer.

As shown in FIG. 8, the first electrode layer further comprises a first connection terminal 24 and a second connection terminal 25, and a fifth electrode 51 of each dummy capacitor 50 is also disposed in a dummy area 102 surrounding the test area 101. The first electrodes 21, the first connection terminal 24, the second connection terminal 25 and the fifth electrodes 51 are disposed on the same layer and formed at the same time by the same patterning process.

Figure 11:
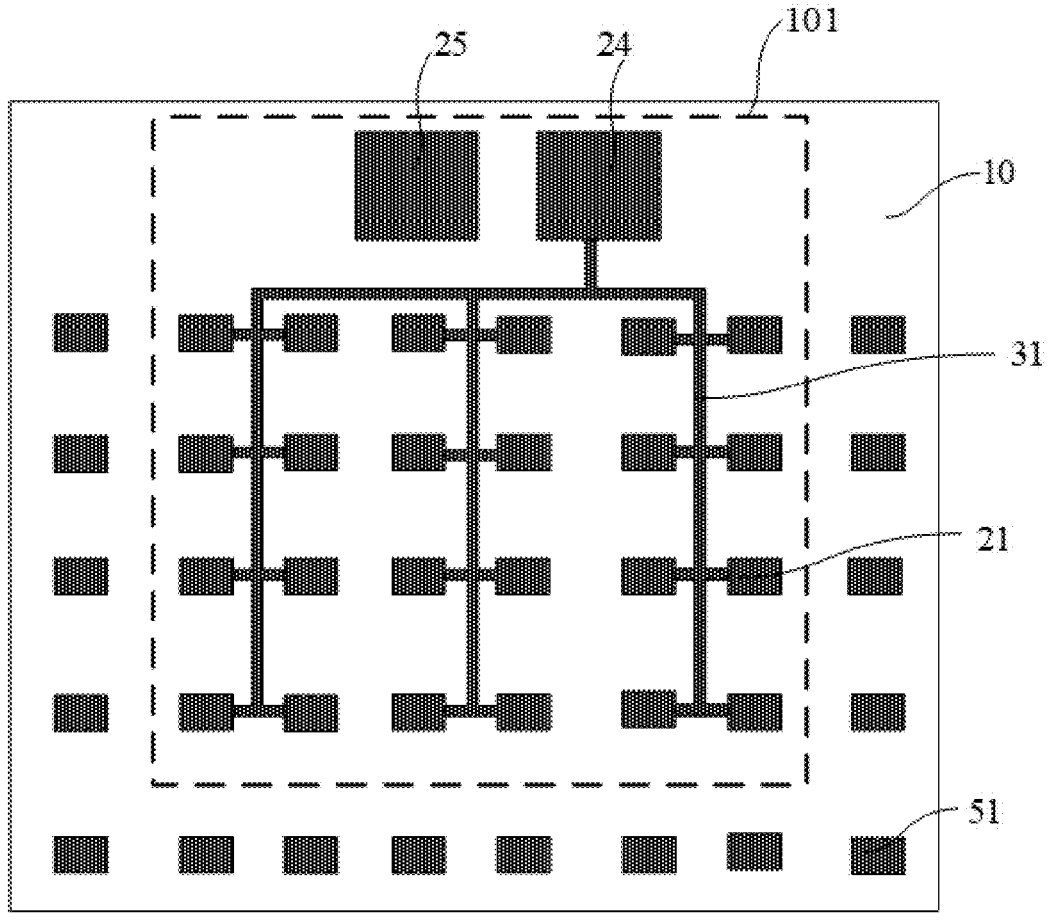
FIG. 11 shows another schematic diagram after a first electrode layer is formed on a base.

As shown in FIG. 11, the first electrode layer further comprises a first connecting wire 31, a first connection terminal 24 and a second connection terminal 25, wherein the first connecting wire 31 is connected to each first electrode 21, and the first connection terminal 24 is connected to the first connecting wire 31. Further, the fifth electrodes 51 of the dummy capacitors 50 are also disposed in the dummy area 102. The first electrodes 21, the first connecting wire 31, the first connection terminal 24, the second connection terminal 25 and the fifth electrodes 51 are disposed on the same layer and formed at the same time by the same patterning process.

It should be noted that the first electrode layer is a first grid layer, and an active layer 42 and a second grid insulating layer 43 are further disposed between the base 10 and the first grid layer. Therefore, after the base 10 is formed, an active layer film is deposited on the base 10 first, Vth doping is conducted on the active layer film to change the electrical characteristics Vth of the active layer film, and the active layer film is coated with a photoresist, so that the active layer 42 is obtained by exposure, development, etching and other processes, wherein the active layer 42 is made of polysilicon; then, the second grid insulating layer 43 covering the active layer 42 and the base 10 is formed, and the material of the second grid insulating layer 43 is at least one of silicon nitride and silicon oxide; and then, the plurality of first electrodes 21 are formed on the second grid insulating layer 43 by a patterning process. In addition, after forming the first electrodes, it is necessary to perform P-Doping on an area, not covered by the first electrodes 21, of the active layer 42, to reduce a resistance value of the area, not covered by the first electrodes 21, of the active layer 42 to form a conducting circuit.

Step 703, forming a first insulating layer covering the first electrodes and the base.

In the embodiment of the disclosure, after the plurality of first electrodes 21 on the base 10 located in the test area 101 are formed, a first insulating layer 22 covering the first electrodes 21 and the base 10 is formed, and the material of the first insulating layer 22 is at least one of silicon nitride and silicon oxide.

Specifically, when the first electrodes 21, the first connection terminal 24, the second connection terminal 25 and the fifth electrodes 51 are disposed on the same layer, the first insulating layer 22 also covers the first connection terminal 24, the second connection terminal 25 and the fifth electrodes 51. When the first electrodes 21, the first connecting wire 31, the first connection terminal 24, the second connection terminal 25 and the fifth electrodes 51 are disposed on the same layer, the first insulating layer 22 also covers the first connecting wire 31, the first connection terminal 24, the second connection terminal 25 and the fifth electrodes 51.

Step 704, forming a plurality of second electrodes on the first insulating layers in the test area to obtain a plurality of test capacitors connected in parallel.

In the embodiment of the disclosure, after the first insulating layer 22 covering the first electrodes 21 and the base 10 is formed, a plurality of second electrodes 23 are formed on the first insulating layer 22 located in the test area 101 by a primary patterning process, each second electrode 23 is an upper polar plate of one test capacitor 20, and the second electrodes 23 of all the test capacitors 20 are located on the second electrode layer.

An overlapping area exists between an orthographic projection of each first electrode 21 on the base 10 and an orthographic projection of the second electrode 23 on the base 10. The storage capacitor disposed in the active area comprises a third electrode, the first insulating layer 22 and a fourth electrode which are disposed in layer configuration, wherein the third electrode is disposed on the same layer as the first electrode 21, the fourth electrode is disposed on the same layer as the second electrode 23, and an overlapping area exists between an orthographic projection of the third electrode on the base 10 and an orthographic projection of the fourth electrode on the base 10. The first electrode 21 of each test capacitor 20 is connected to the first test terminal 33 through the first connecting wire 31, and the second electrode 23 of each test capacitor 20 is connected to the second test terminal 34 through the second connecting wire 32.

In order to connect the first electrode 21 of each test capacitor 20 to the first test terminal 33 through the first connecting wire 31 and the second electrode 23 of each test capacitor 20 to the second test terminal 34 through the second connecting wire 32, after the plurality of second electrodes 23 on the first insulating layer 22 located in the test area 101 are formed, it is necessary to form a second insulating layer 41 covering each second electrode 23 and the first insulating layer 22, and then form a third electrode layer on the second insulating layer 41 by a patterning process.

Figure 9:
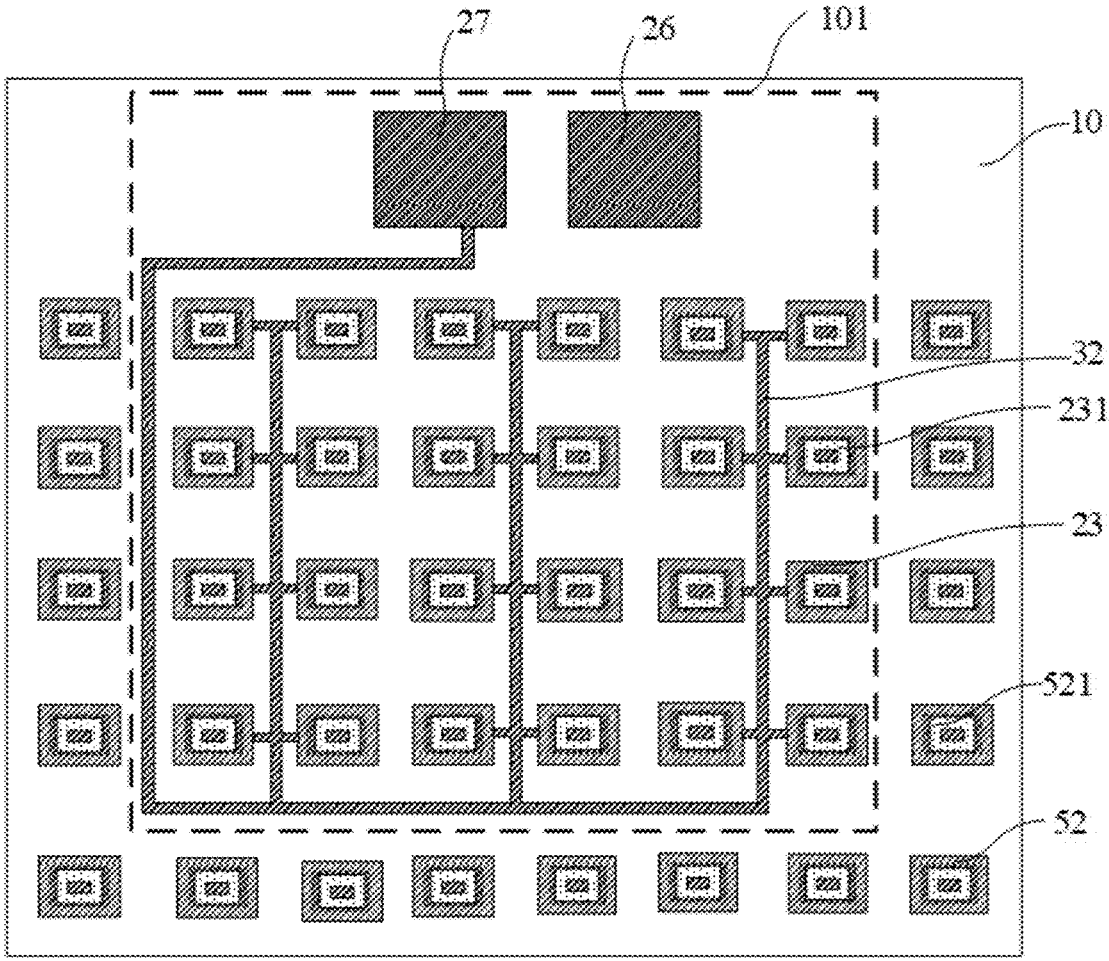
FIG. 9 shows a schematic diagram after a second electrode layer is formed on the basis of FIG. 8.

In an optional embodiment of the disclosure, as shown in FIG. 9, the second electrode layer further comprises a second connecting wire 32, a third connection terminal 26 and a fourth connection terminal 27, wherein the second connecting wire 32 is connected to the second electrode 23 of each test capacitor 20, and the fourth connection terminal 27 is connected to the second connecting wire 32. In addition, a sixth electrode 52 of each dummy capacitor 50 is also disposed in the dummy area 102 surrounding the test area 101. The second electrodes 23, the second connecting wire 32, the third connection terminal 26, the fourth connection terminal 27 and the sixth electrodes 52 are disposed on the same layer and formed at the same time by the same patterning process.

In order to avoid the contact between the second electrodes 23 and the first connecting wire 31 formed later, each second electrode 23 has a seventh via hole 231, and the seventh via hole 231 exposes part of the first insulating layer 22. Accordingly, the sixth electrode 52 of each dummy capacitor 50 also has a ninth via hole 521, and the ninth via hole 521 also exposes part of the first insulating layer 22.

Figure 10:
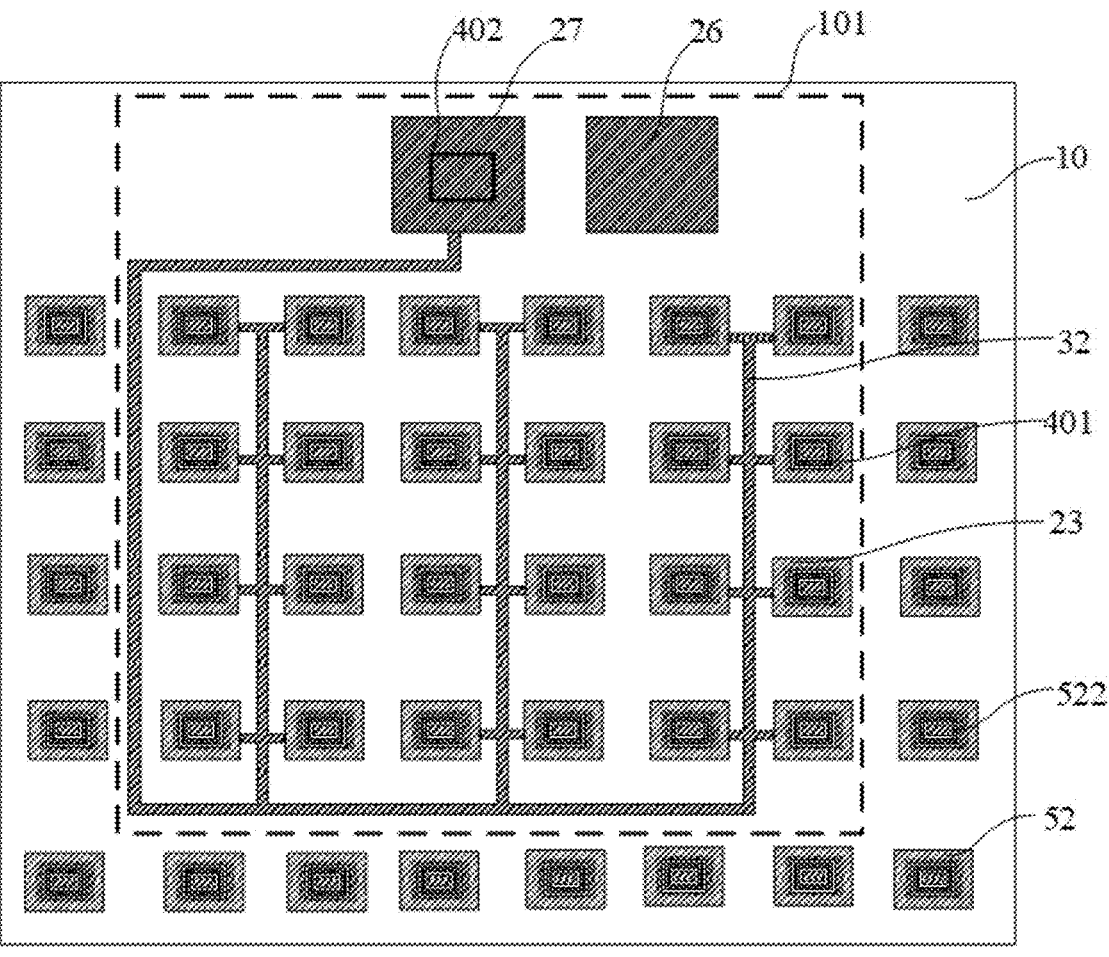
FIG. 10 shows a diagram after a second insulating layer is formed on the basis of FIG. 9.

After the second electrode layer and the sixth electrodes 52 are formed, a second insulating layer 41 covering the second electrode layer, the sixth electrodes 52 and the first insulating layer 22 is formed. As shown in FIG. 10, the second insulating layer 41 and the first insulating layer 22 have first via holes 401, the first via holes 401 expose part of the first electrodes 21, the second insulating layer 41 has second via holes 402, and the second via holes 402 expose part of the fourth connection terminals 22. In addition, the corresponding positions of the dummy capacitors 20 also have tenth via holes 522 penetrating through the second insulating layer 41 and the first insulating layer 22, and the tenth via holes 522 expose part of the fifth electrodes 51 and are located in an area surrounded by the ninth via holes 521.

Finally, a third electrode layer is formed on the second insulating layer 41 by a patterning process to obtain the array substrate shown in FIG. 1. In this case, the third electrode layer comprises the first connecting wire 31, the first test terminal 33 and the second test terminal 34. The first test terminal 33 is connected to the first connecting wire 31, the first connecting wire 31 is connected to each first electrode 21 through the first via hole 401, the second test terminal 34 is connected to the fourth connection terminal 27 through the second via hole 402, the fourth connection terminal 27 is also connected to the second connecting wire 32, and the second connecting wire 32 is connected to each second electrode 23 of each test capacitor 20.

Figure 12:
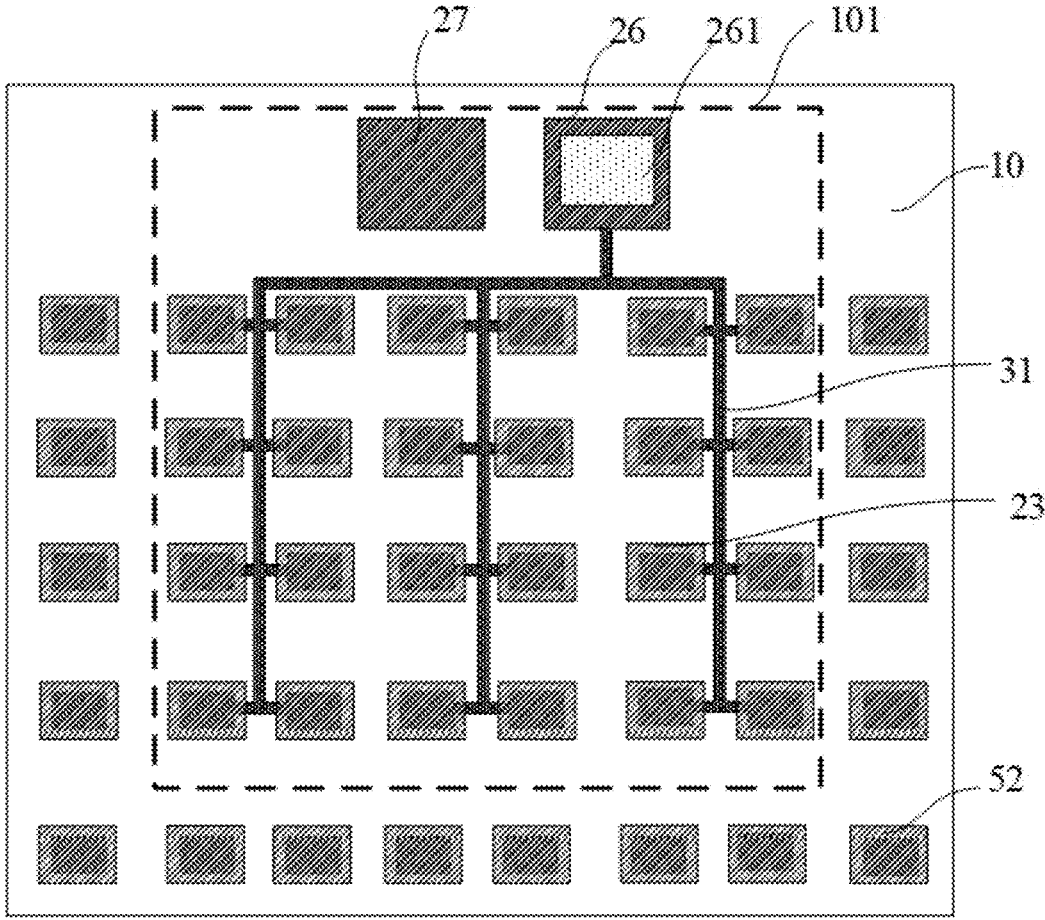
FIG. 12 shows a schematic diagram after a second electrode layer is formed on the basis of FIG. 11.

In another optional embodiment of the disclosure, as shown in FIG. 12, the second electrode layer further comprises a third connection terminal 26 and a fourth connection terminal 27, and a sixth electrode 52 of each dummy capacitor 50 is also disposed in the dummy area 102 surrounding the test area 101. The second electrodes 23, the third connection terminal 26, the fourth connection terminal 27 and the sixth electrodes 52 are disposed on the same layer and formed at the same time by the same patterning process.

In order to avoid the contact between the third connection terminal 26 and the first test terminal 33 formed later, the third connection terminal 26 has an eighth via hole 261, and the eighth via hole 261 exposes part of the first insulating layer 22.

Figure 13:
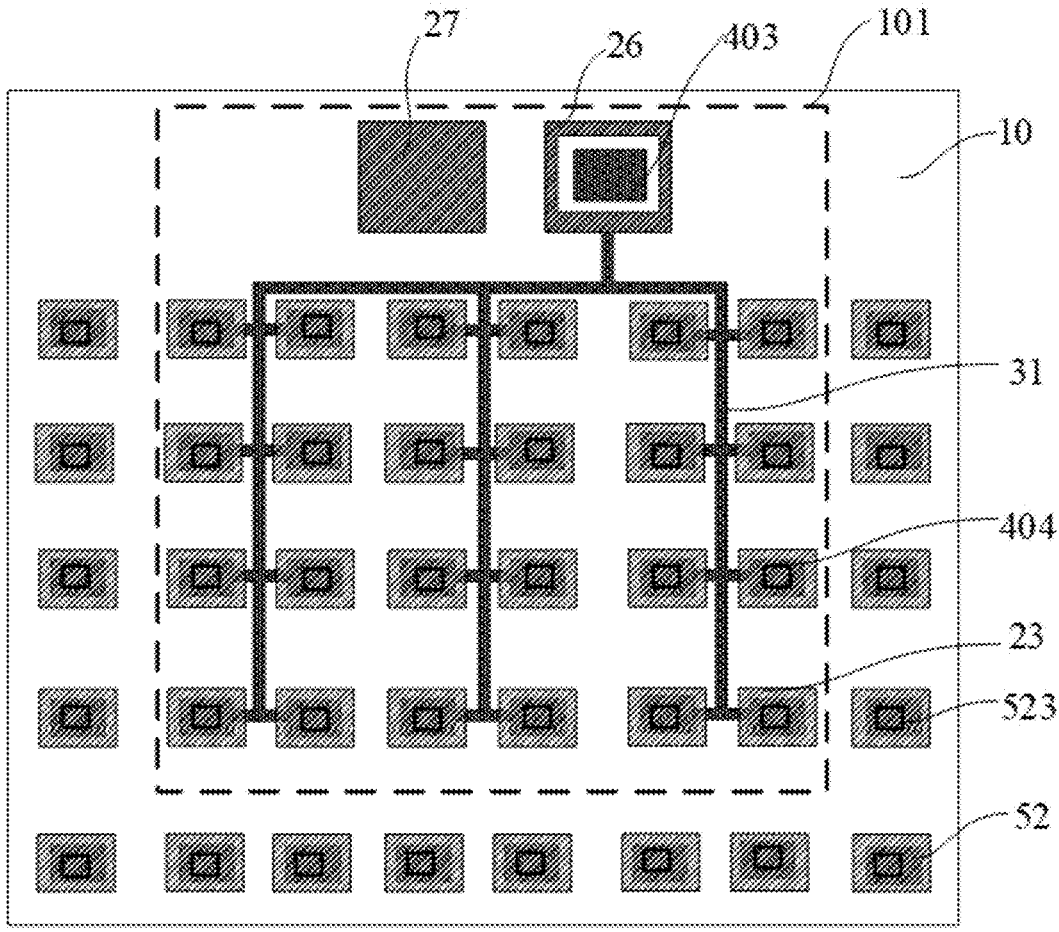
FIG. 13 shows a diagram after a second insulating layer is formed on the basis of FIG. 12.

After the second electrode layer and the sixth electrodes 52 are formed, a second insulating layer 41 covering the second electrode layer, the sixth electrodes 52 and the first insulating layer 22 is formed. As shown in FIG. 13, the second insulating layer 41 and the first insulating layer 22 have third via holes 403, the third via holes 403 expose part of the first connection terminal 24, and the third via holes are located in an area surrounded by the eighth via hole 261. The second insulating layer 41 has a fourth via hole 404, and the fourth via hole 404 exposes part of the second electrodes 23. In addition, the corresponding positions of the dummy capacitors 20 also have eleventh via holes 523 penetrating through the second insulating layer 41, and the eleventh via holes 523 expose part of the sixth electrodes 52.

Finally, a third electrode layer is formed on the second insulating layer 41 by a patterning process to obtain the array substrate shown in FIG. 4. In this case, the third electrode layer comprises a second connecting wire 32, a first test terminal 33 and a second test terminal 34, the second test terminal 34 is connected to the second connecting wire 32, the second connecting wire 32 is connected to each second electrode 23 through the fourth via holes 404, the first test terminal 33 is connected to the first connection terminal 24 through the third via hole 403, the first connection terminal 24 is connected to the first connecting wire 31, and the first connecting wire 31 is connected to each first electrode 21.

Figure 14:
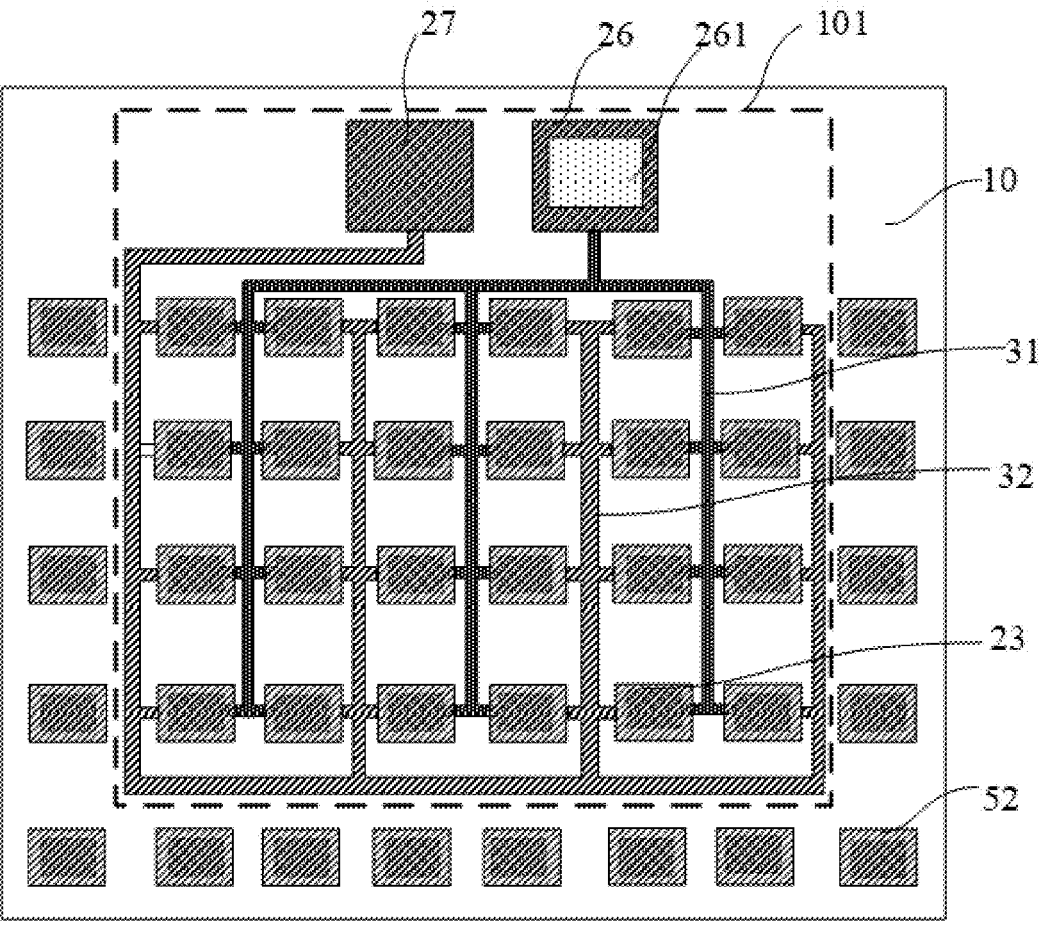
FIG. 14 shows a schematic diagram after another second electrode layer is formed on the basis of FIG. 11.

In another optional embodiment of the disclosure, as shown in FIG. 14, the second electrode layer further comprises a second connecting wire 32, a third connection terminal 26 and a fourth connection terminal 27, wherein the second connecting wire 32 is connected to the second electrode 23 of each test capacitor 20, and the fourth connection terminal 27 is connected to the second connecting wire 32. In addition, a sixth electrode 52 of each dummy capacitor 50 is also disposed in the dummy area 102 surrounding the test area 101. The second electrodes 23, the second connecting wire 32, the third connection terminal 26, the fourth connection terminal 27 and the sixth electrodes 52 are disposed on the same layer and formed at the same time by the same patterning process. In order to avoid the contact between the third connection terminal 26 and the first test terminal 33 formed later, the third connection terminal 26 has an eighth via hole 261, and the eighth via hole 261 exposes part of the first insulating layer 22.

Figure 15:
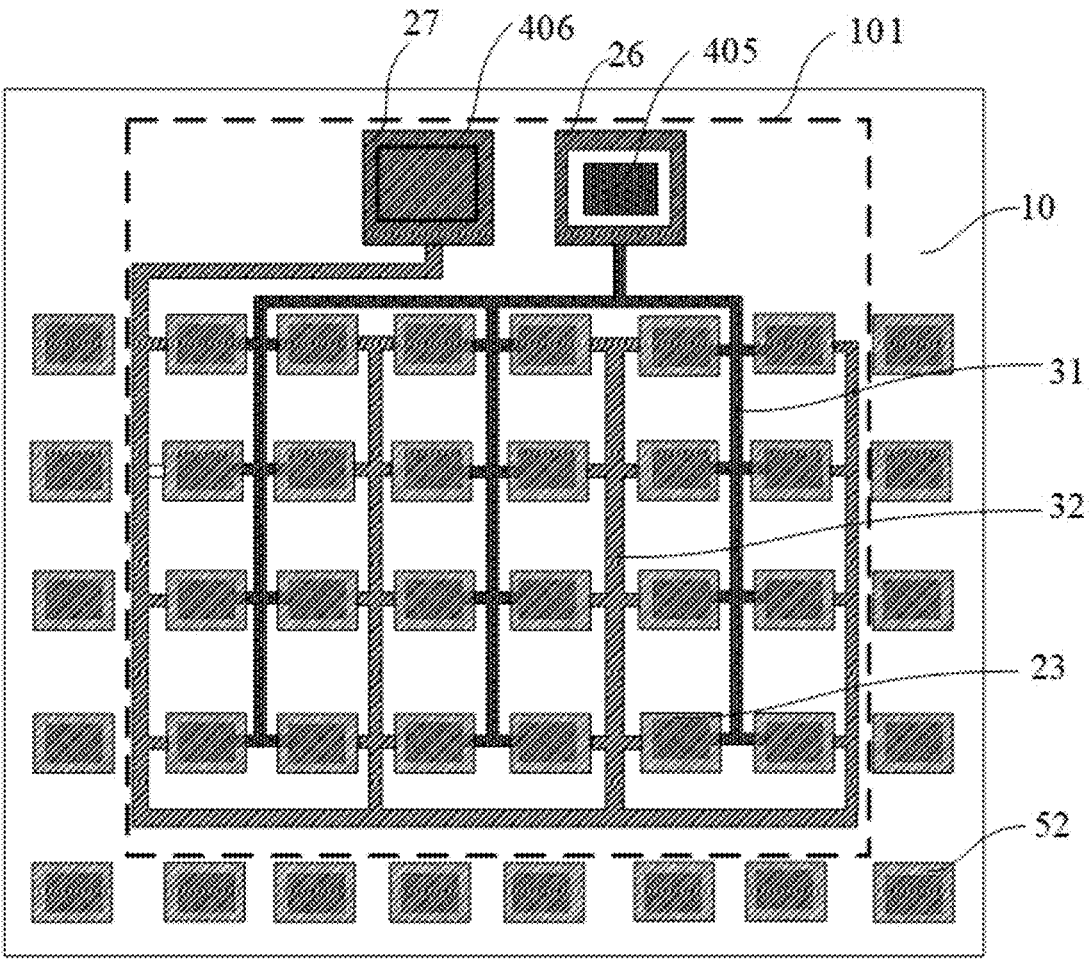
FIG. 15 shows a diagram after a second insulating layer is formed on the basis of FIG. 14.

After the second electrode layer and the sixth electrodes 52 are formed, a second insulating layer 41 covering the second electrode layer, the sixth electrodes 52 and the first insulating layer 22 is formed. As shown in FIG. 15, the second insulating layer 41 and the first insulating layer 22 have fifth via holes 405, the fifth via holes 405 expose part of the first connection terminal 24, the fifth via holes 405 are located in an area surrounded by the eighth via hole 261, the second insulating layer 41 has a sixth via hole 406, and the sixth via hole 406 exposes part of the fourth connection terminal 27.

Finally, a third electrode layer is formed on the second insulating layer 41 by a patterning process to obtain the array substrate shown in FIG. 5. In this case, the third electrode layer comprises a first test terminal 33 and a second test terminal 34. The first test terminal 33 is connected to the first connection terminal 24 through the fifth via hole 405, the first connection terminal 24 is connected to the first connecting wire 31, and the first connecting wire 31 is connected to each first electrode 21. The second test terminal 34 is connected to the fourth connection terminal 27 through the sixth via hole 406, the fourth connection terminal 27 is connected to the second connecting wire 32, and the second connecting wire 32 is connected to each second electrode 23.

In the embodiment of the disclosure, the plurality of test capacitors are disposed in the test area of the array substrate, each test capacitor has the same film structure as the storage capacitor disposed in the active area, the first electrode of each test capacitor is connected to the first test terminal through the first connecting wire, and the second electrode of each test capacitor is connected to the second test terminal through the second connecting wire, so that the plurality of test capacitors are connected in parallel. The plurality of test capacitors connected in parallel and disposed in the test area can be used subsequently for testing, the detected value of capacitance changes more significantly and the detection result is more accurate, and accordingly, the performance of the storage capacitor may be detected more easily and accurately, so that the storage capacitor disposed in the active area may be effectively monitored.

The embodiments of the disclosure also provide a displaying device, which comprises the above array substrate.

In practical application, the displaying device is an Organic Light-Emitting Diode (OLED) displaying device, which may be any product or component with a display function such as mobile phone, tablet personal computer, monitor, notebook computer, navigator, etc.

For the sake of simple description, all the aforementioned method embodiments are expressed as a series of action combinations, but those people skilled in the art should know that this disclosure is not limited by the described action sequence, because according to this disclosure, some steps may be performed in other sequences or at the same time. Those people skilled in the art should also know that the embodiments described in the specification are all preferred embodiments, and the actions and modules involved are not necessarily a must for this disclosure.

All the embodiments in this specification are described in a progressive way, and each embodiment focuses on the differences from other embodiments. The same and similar parts among the embodiments are referable to one another.

It should be also noted that herein, relational terms such as "first" and "second" are only used to distinguish one entity or operation from another entity or operation, and do not necessarily require or imply any such actual relationship or order between these entities or operations. The terms "comprise", "include" or any other variations thereof, are intended to cover a non-exclusive inclusion, such that a process, method, article, or device which includes a list of elements does not include only those elements but also other elements not expressly listed or inherent to such process, method, article, or device. Without further limitation, an element defined by the statement "includes a . . . " does not exclude the presence of another identical element in a process, method, article or device that includes the element.

The array substrate, the testing method and manufacturing method thereof, and the displaying device provided by the disclosure are described in detail above. Specific examples are applied herein to illustrate the principle and implementation of the disclosure. The above embodiments are only used to help understand the method of the disclosure and its core ideas. Those of ordinary skill in the art can make some changes to the specific implementation and application scope according to the idea of this disclosure. To sum up, the contents of this specification should not be understood as a limitation of this disclosure.

The invention claimed is:

1. An array substrate, comprising a test area;
wherein the array substrate located in the test area comprises a plurality of test capacitors connected in parallel, a first connecting wire, a second connecting wire, a first test terminal and a second test terminal;
each of the test capacitors comprises a first electrode, a first insulating layer and a second electrode which are disposed in layer configuration on a base, and an overlapping area exists between an orthographic projection of the first electrode on the base and an orthographic projection of the second electrode on the base, wherein the first electrode of each of the test capacitors is located in a first electrode layer, and the second electrode of each of the test capacitors is located in a second electrode layer;
the first electrode of each of the test capacitors is connected to the first test terminal through the first connecting wire, and the second electrode of each of the test capacitors is connected to the second test terminal through the second connecting wire; and
the array substrate located in the test area further comprises a second insulating layer disposed on a side, away from the first insulating layer, of the second electrode layer, and a third electrode layer disposed on a side, away from the second electrode layer, of the second insulating layer, the first connecting wire is connected to the first electrode of each of the test capacitors through a first via hole penetrating through the second insulating layer and the first insulating layer, and each of the second electrodes has a seventh via hole, the first via hole is located in an area enclosed by the seventh via hole, and the first via hole and second electrode are separated by the second insulating layer.

2. The array substrate according to claim 1, wherein the first connecting wire, the first test terminal and the second test terminal are all located in the third electrode layer, and the second connecting wire is located in the second electrode layer; and the second connecting wire and the second electrode of each of the test capacitors are disposed on a same layer and connected to each other, and the second test terminal is connected to the second connecting wire through a second via hole penetrating through the second insulating layer.

3. The array substrate according to claim 1, wherein an orthographic projection of the first via hole and the seventh via hole on the base are annular.

4. The array substrate according to claim 1, wherein in the test area, no overlapping area exists between an orthographic projection of the first connecting wire on the base and an orthographic projection of the second connecting wire on the base.

5. The array substrate according to claim 1, further comprising a dummy area surrounding the test area;

the array substrate located in the dummy area comprises a plurality of dummy capacitors, and the plurality of dummy capacitors surround the test capacitor disposed in the test area; and each of the dummy capacitors comprises a fifth electrode, the first insulating layer and a sixth electrode which are disposed in layer configuration, the fifth electrode is disposed on a same layer as the first electrode, the sixth electrode is disposed on a same layer as the second electrode, and an overlapping area exists between an orthographic projection of the fifth electrode on the base and an orthographic projection of the sixth electrode on the base.

6. The array substrate according to claim 1, wherein the plurality of test capacitors located in the test area are distributed in an array.

7. The array substrate according to claim 1, wherein in a row direction along the array substrate, a first size of two adjacent test capacitors is 30-40 μm; and in a column direction of the array substrate, a second size of two adjacent test capacitors is 60-70 μm.

8. The array substrate according to claim 1, wherein the first electrode layer is a first grid layer, the second electrode layer is a second grid layer, the first insulating layer is the first grid insulating layer, the second insulating layer is an interlayer dielectric layer, and the third electrode layer is a source-drain electrode layer; and an active layer and a second grid insulating layer are further disposed between the base and the first grid layer, and the second grid insulating layer is located on a side, away from the base, of the active layer.

9. A testing method of an array substrate, wherein the method is configured to the array substrate according to claim 1, and comprising:

inputting a scanning signal to the second electrode of each of the capacitors through the second test terminal;

receiving an induction signal output by the first electrode of each of the test capacitors through a first test terminal; and determining a ratio of a practical value of capacitance corresponding to the induction signal to the number of the test capacitors as a value of capacitance for each of the test capacitors.

10. A manufacturing method of an array substrate, comprising:

providing a base, the base comprising a test area;

forming a plurality of first electrodes on the base in the test area;

forming a first insulating layer covering the first electrode and the base; and forming a plurality of second electrodes on the first insulating layer in the test area to obtain a plurality of test capacitors connected in parallel; and wherein an overlapping area exists between an orthographic projection of each of the first electrodes on the base and an orthographic projection of the second electrode on the base, wherein the first electrode of each of the test capacitors is located in a first electrode layer, and the second electrode of each of the test capacitors is located in a second electrode layer;

the first electrode of each of the test capacitors is connected to a first test terminal through a first connecting wire, and the second electrode of each of the test capacitors is connected to a second test terminal through a second connecting wire; and the array substrate located in the test area further comprises a second insulating layer disposed on a side, away from the first insulating layer, of the second electrode layer, and a third electrode layer disposed on a side, away from the second electrode layer, of the second insulating layer, the first connecting wire is connected to the first electrode of each of the test capacitors through a first via hole penetrating through the second insulating layer and the first insulating layer, and each of the second electrodes has a seventh via hole, the first via hole is located in an area enclosed by the seventh via hole, and the first via hole and the second electrode are separated by the second insulating layer.

11. A displaying device, comprising the array substrate according to claim 1.

* * * * *